(12) United States Patent
Rachmawati et al.

(10) Patent No.: US 10,578,667 B2
(45) Date of Patent: Mar. 3, 2020

(54) METHODS AND SYSTEMS FOR DETECTING, CLASSIFYING AND/OR MITIGATING SENSOR ERROR

(71) Applicant: ROLLS-ROYCE plc, London (GB)

(72) Inventors: Lily Rachmawati, Singapore (SG); Yuhai Xue, Singapore (SG)

(73) Assignee: ROLLS-ROYCE plc, London (GB)

( * ) Notice: Subject to any disclaimer, the term of this patent is extended or adjusted under 35 U.S.C. 154(b) by 90 days.

(21) Appl. No.: 15/544,224

(22) PCT Filed: Jan. 18, 2016

(86) PCT No.: PCT/EP2016/050907
§ 371 (c)(1),
(2) Date: Jul. 17, 2017

(87) PCT Pub. No.: WO2016/120112
PCT Pub. Date: Aug. 4, 2016

(65) Prior Publication Data
US 2017/0370985 A1   Dec. 28, 2017

(30) Foreign Application Priority Data
Jan. 30, 2015   (GB) .................................. 1501534.0

(51) Int. Cl.
*G01R 31/28*   (2006.01)
*G05B 9/02*   (2006.01)
*G05B 23/02*   (2006.01)

(52) U.S. Cl.
CPC .......... *G01R 31/2829* (2013.01); *G05B 9/02* (2013.01); *G05B 23/0221* (2013.01); *G05B 23/0227* (2013.01); *G05B 23/024* (2013.01)

(58) Field of Classification Search
CPC .. G01R 31/2829; G05B 9/02; G05B 23/0221; G05B 23/0227; G05B 23/024
324/329–348, 323, 447, 425, 200, 206, 324/256–259, 600, 637, 639
See application file for complete search history.

(56) References Cited

U.S. PATENT DOCUMENTS 4,780,826 A   10/1988   Nakano et al.
4,788,398 A   11/1988   Hornung
(Continued)

FOREIGN PATENT DOCUMENTS

EP   1 630 635 A2   3/2006
WO   01/48571 A1   7/2001

OTHER PUBLICATIONS

Oct. 28, 2015 Search Report issued in British Patent Application No. 1501534.0.
(Continued)

*Primary Examiner* — Melissa J Koval
*Assistant Examiner* — Trung Nguyen
(74) *Attorney, Agent, or Firm* — Oliff PLC (57) ABSTRACT

Methods and systems automatically detect, classify and/or mitigate sensor errors using partial qualitative and quantitative knowledge of the subsystems. In various examples, sensor fault detection is performed with a custom designed representation scheme covering causality, correlation, system of equality and inequalities, and an associated logic. The logic is described by a set of algorithmic steps to iteratively assign trustworthiness level of sensors. Sensor fault classification is performed by combining mathematical and statistical techniques that can be utilized to expose bias, drift, multiplicative calibration error, precision degradation and spike error. Sensor fault mitigation is also performed on identified bias, drift, multiplicative calibration error, precision degradation and spike error.

12 Claims, 6 Drawing Sheets

(56) References Cited

U.S. PATENT DOCUMENTS

| | | | |
|---|---|---|---|
| 5,414,645 A | | 5/1995 | Hirano |
| 5,554,969 A | | 9/1996 | Eguchi |
| 5,636,137 A | | 6/1997 | Hazelden |
| 5,950,597 A | | 9/1999 | Kamio et al. |
| 6,016,465 A | * | 1/2000 | Kelly ................. G05B 23/0235 376/215 |
| 6,598,195 B1 | | 7/2003 | Adibhatla et al. |
| 7,286,917 B2 | | 10/2007 | Hawkins et al. |
| 8,521,354 B2 | | 8/2013 | Sasaki |
| 2006/0224357 A1 | * | 10/2006 | Taware ................... G05B 9/02 702/179 |
| 2008/0312756 A1 | | 12/2008 | Grichnik et al. |
| 2012/0053853 A1 | * | 3/2012 | Tan .................... B60W 40/105 702/35 |
| 2013/0124127 A1 | * | 5/2013 | Ahuja ................... G01C 25/00 702/86 |

OTHER PUBLICATIONS

Da Silva et al., "A knowledge-based system approach for sensor fault modeling, detection and mitigation," Expert Systems with Applications, 2012, vol. 39, pp. 10977-10989.

Kitamura, M. "Detection of Sensor Failures in Nuclear Plants Using Analytic Redundancy," American Nuclear Society Annual Meeting, Jun. 8-13, 1980.

Kullaa, J. "Detection, identification and quantification of sensor fault in a sensor network." Mechanical Systems and Signal Processing, 2013, vol. 40, pp. 208-221.

Rajagopal et al., "Distributed Online Simultaneous Fault Detection for Multiple Sensors," Information Processing in Sensor Networks, 2008 pp. 1-12.

Xu X et al., "On-Line Sensor Calibration Monitoring and Fault Detection for Chemical Processes," Maintenance and Reliability Center, 1998.

Koushanfar et al., "On-line Fault Detection of Sensor Measurements," IEEE 2003, pp. 974-979.

Tseng et al., "Robust Model-based Fault Detection for Roll Rate Sensor," Proceedings of the 42nd IEEE Conference on Decision and Control, 2003, pp. 1968-1973.

Li Jiang, "Sensor Fault Detections and Isolation Using System Dynamics Identification Techniques," Doctor of Philosophy (Mechanical Engineer) dissertation, The University of Michigan, 2011.

Apr. 4, 2016 Search Report issued in International Patent Application No. PCT/EP2016/050907.

Apr. 4, 2016 Written Opinion issued in International Patent Application No. PCT/EP2016/050907.

* cited by examiner

METHODS AND SYSTEMS FOR DETECTING, CLASSIFYING AND/OR MITIGATING SENSOR ERROR

TECHNOLOGICAL FIELD

The present disclosure relates to methods and systems for detecting, classifying and/or mitigating sensor error. It is particularly, but not exclusively, concerned with error detection, classification and mitigation in complex systems where an accurate and comprehensive system-wide computational or mathematical model is not available.

BACKGROUND

Existing sensor fault detection processes typically operate on the basis of the hardware redundancy principle and/or the analytical redundancy principle. Hardware redundancy schemes utilize multiple sensors with replicated or correlated readings of signal(s) while analytical redundancy schemes rely on mathematical models of the system being measured to generate an expected value or shape.

In techniques based on hardware redundancy, sensor fault is diagnosed when expected correlation and/or agreement between multiple designated sensors is absent. In particular, measurement models and sensor network models are employed to check whether a sensor within the set of correlated/replicated sensors has failed using techniques such as Principal Component Analysis, Independent Component Analysis, factor analysis or Minimized Mean Squared Error.

In techniques based on analytical redundancy, an expected value of the signal being measured is computed by a computational model of the system. Deviation of the measured signal from this reference, either as an absolute value, or in terms of the shape of the signal, is employed to diagnose sensor fault. The software-based system model needs to produce a reasonably accurate estimate of the variable being measured, and can be developed from physics-based description of the system, from heuristics/rules of thumb represented in artificial intelligence constructs (e.g. fuzzy logic or rule based systems), or deduced from past data of sensor networks known to function perfectly using statistical learning techniques.

Specific examples of the two classes of sensor fault detection in patents and academic publications are set out below.

U.S. Pat. No. 6,016,465 describes a method based on analytical redundancy, where sensor fault is detected with the deviation of measured signal shape from the expected reference instead of the actual value. In the method, outlines of modified measured signal and corresponding modified reference signal over a finite time window are compared by means of a correlation coefficient. The reference signal is generated by a software model of the system under measurement, and modified by a multiplication factor, subtraction of the mean level and any hybrid of values from modified reference signal. Modifications to measured signals are performed in like manner. Both series, i.e. the reference and the measured, are continuously updated with most recent values and their shape compared to within pre specified deviation thresholds.

U.S. Pat. No. 7,286,917 describes a method based on the analytical redundancy principle to detect vehicle speed sensor failure. The system model is provided by a set of heuristics that determine whether the speed measured indicates sensor fault, as described in the flowchart below. When the speed measured is below threshold, fueling rate is greater than threshold, engine speed is greater than minimum threshold, transmission is not in neutral and not in converter mode, at least n number of times then a fault is logged.

U.S. Pat. No. 8,521,354 describes a method to diagnose faults in sensors of airflow mass, O2 intake, fuel injection in an internal combustion engine. The method combines the hardware redundancy principle, i.e. multiple sensors replicate measurement of a key quantity, and analytical redundancy, i.e. an estimation model computes expected values of quantities measured (see FIGS. 3 and 8 of this patent). The EGR values are for example computed with two different methods from different measurements and compared with theoretical values from an EGR map. Fuel injection and airflow mass sensor fault are diagnosed in a simpler comparison with real time calculation of expected values.

U.S. Pat. No. 5,636,137 describes a feedback control which includes a sensor failure detection function especially for but not limited to power assisted steering systems. The method relies on hardware redundancy, with two photo detector units independently measuring LED light indicative of angular displacement or torque applied between input and output. Variation in the sum of the signals generated by the photodetector indicates sensor fault(s).

U.S. Pat. No. 6,598,195 describes a hardware redundancy approach to sensor fault detection. A modeled sensor value of each sensor is given as a function of a set of other sensors values (the sensor consistency model in FIG. 1 of this patent), and any deviation from expected value beyond the threshold indicates a fault is present in the network of sensors. Hypothesis testing and maximum wins strategy isolate the faulty sensor once a fault in the network is diagnosed. Sensor failure accommodation is then performed by substituting the modelled value for the actual measured value.

U.S. Pat. No. 5,554,969 describes an analytical redundancy approach to detect wheel steering angle sensor fault with system model given by rules of thumb. The detection of failure in the rear road wheel steering angle sensor is carried out on the basis of whether a target deviation between a rear road wheel steering angle sensor value and a target rear road wheel steering angle exceeds a predetermined deviation value and whether a generation time duration during which the target deviation exceeds the predetermined deviation value has continued over a predetermined period of time. In addition, the detection of failure in the rear road wheel steering angle sensor is carried out on the basis of whether an accumulated value of a rear road wheel steering angle estimated deviation exceeds a predetermined threshold value a when such conditions as a monotonous variation in a servo current applied to the motor in the four wheel steering system, a monotonous variation in a rear road wheel steering angle estimated deviation, and same directional monotonous variations in the servo current and in the rear road wheel steering angle estimated deviation are satisfied Silva, J C et al. "A knowledge based system approach for sensor fault modelling, detection and mitigation." Expert Systems with Applications, 2012, pp 10977-10989 describes a combination of semantic network, object oriented models and rules to detect common sensor faults (bias, drift, scaling), derived from an Artificial Neural Network (ANN) for fault detection and disambiguation. The ANN is a machine learning technique that learns to accurately detect and disambiguate fault from data. Sensor fault detection is performed with analytical redundancy and fault mitigation is performed by utilizing partial sensor redundancy and sensor correction.

Xu, X. et al. "Online sensor calibration monitoring and fault detection for chemical processes." Maintenance and Reliability Conference, 1998 describes an artificial neural network for instrument surveillance and calibration verification system, given in the following figure. The ANN essentially models the system and produces an estimate to be compared with (corrected) measured signal. The difference between the two is fed into a statistical decision module that diagnoses a fault or otherwise based on the profile of the variance and mean of the residual.

Rajagopal, R. et al. "Distributed online simultaneous fault detection for multiple sensors." Information Processing in Sensor Networks, 2008 presents a distributed, online, sequential algorithm for detecting multiple faults in a sensor network for a time varying noisy environment. The algorithm works by detecting change points in the correlation statistics of neighbouring sensors, requiring only neighbours to exchange information. The algorithm provides guarantees on detection delay and false alarm probability. The method utilizes hardware redundancy and requires that functioning neighboring sensors to measure correlated variables, that the measurements of a faulty sensor and a neighboring working sensor are not correlated, and that the average time between successive faults to be longer than the time between significant changes in the environment.

Kulla, J. "Detection, identification and quantification of sensor fault." Mechanical Systems and Signal Processing, October 2013, vol. 40(1), pp. 208-221 describes a hardware redundancy approach for detecting bias, gain, drift, precision degradation, noise and complete failure by modeling each sensor as a conditional probability density function given the other sensors in the network. Each sensor in the network is modeled using the minimum mean squared error estimation and sensor fault identified using multiple hypothesis test with generalized likelihood ratio.

Hardware redundancy techniques generally require replication and/or sensor models that remain valid in practice. If the sensor models are not satisfied then the method will fail. Hardware redundancy is also expensive (normally due to the replication).

Analytical redundancy techniques rely on the estimated value/shape of the measured variable and therefore normally require reasonably accurate system models. Developing such models for very complex systems from the basic physics can involve high computational cost and may not be possible at all for some complex systems that operate in a partially observable, time-varying environment like a marine vessel. Heuristics or rules of thumb of overall system behaviour can be developed into reasonably robust models of how the system should behave but are normally very application specific and require a lengthy period of observation. Also, observation noise and a time varying environment can easily lead to false positives or true negatives in analytical redundancy approaches. Learning the model from data is an attractive option but again requires a large amount of data and will not perform well when the situation at hand deviates significantly from the training data distribution.

Typically, the prior art requires a good system model and/or sensor model and/or robust rules of thumb and/or extensive high quality operational data to work.

BRIEF SUMMARY

At their broadest, various examples provide methods and systems which automatically detect, classify and/or mitigate sensor errors.

According to a first aspect there is provided a method for detecting sensor error in a system having a plurality of subsystems and a number of sensors associated with said subsystems, each sensor producing at least one respective sensor output, the method including the steps of: identifying a plurality of principles of the subsystems, which relate the expected sensor outputs of two or more of said sensors to each other; representing said principles by a set of system equations suitable for computation; deducing the degree of reliability of each of said sensor outputs based on whether the or each system equation involving said sensor output is satisfied or not and the known degree of reliability of other sensor outputs in said system equation; and assigning a trustworthiness level to each of said sensor outputs based on said deduction.

The principles of the subsystems identified may be derived from first principles, i.e. from underlying engineering or physical relationships, but can also include empirical "rules of thumb" which are derived from experience of the operation of the system or subsystem over time.

The method of this aspect is designed for use in complex systems where partial qualitative or quantitative knowledge is available about the components/subsystems that make up the entire system. However, preferably no comprehensive system model is required. The applicability of the method of this aspect is also not limited to specific systems as it can work on universal physics based rules on any subset of the system, unlike heuristics based analytic redundancy techniques.

The method of this aspect can remove the need for hardware redundancy, although such redundancy could improve mitigation in the event of complete sensor failure.

Because it relies on interrelationship and internal consistency between sensor signals, the method of this aspect can remain valid where the operating environment changes or the system drifts.

Preferably the method of this aspect uses partial qualitative and quantitative knowledge of the system and the sensors. Sensor fault detection can be performed with a custom designed representation scheme which may include causality, correlation, equalities and inequalities between various sensor outputs, and an associated logic. The logic may be a set of algorithmic steps to iteratively assign a trustworthiness level to the sensors.

The method may therefore be able to automatically detect sensor fault without a comprehensive and accurate system model. It is able to capture and utilize partial and qualitative as well as quantitative knowledge available of the systems/subsystems for sensor fault detection.

In certain embodiments, the method may include the step of, prior to said deduction, assigning a trustworthiness level to one or more of the sensors based on a priori information about said sensor(s). This can allow sensors which are known to be particularly reliable to be pre-classified as such, or similar incorporation of knowledge about the trustworthiness of a particular sensor prior to carrying out the deduction based on the system equations.

The step of deducing may order the system equations based on the number of signals involved and the trustworthiness of those signals and work through the equations in said order starting with the equation with the most signals and the highest degree of reliability. This approach allows the reliability or trustworthiness of the signals to be deduced starting from the situations in which the system has the least uncertainty about which sensors are reliable or not.

In certain embodiments, the step of assigning a trustworthiness level involves the following sub-steps: a) identifying any sensor outputs that can be independently verified and assigning a very high trustworthiness to such outputs; assigning an indeterminate trustworthiness to all other signals; b) sorting the system equations based on the number of sensor outputs involved in each equation; c) counting the number of outputs assigned to each trustworthiness level; d) selecting one of the system equations which involves the lowest number of sensor outputs; e) assigning trustworthiness to the outputs in said equation as follows: i) if the equation is a causation, correlation, or equality, and the equation is satisfied by the sensor outputs involved, assign a very high trustworthiness to all outputs in said equation; ii) if the equation is a causation, correlation, or equality and the equation is not satisfied by the sensor outputs involved, determine whether there is more than one sensor output included in the equation which has not been assigned a very high or a very low trustworthiness level: if there is more than one such output, then assigning a low trustworthiness level to those outputs; and if there is only one such output, then assigning a very low trustworthiness level to that output; iii) if the equation is an inequality and the inequality is satisfied, assigning a high trustworthiness level to any signal in that equation which has not previously been assigned a very high or very low trustworthiness level; iv) if the equation is an inequality and the inequality is not satisfied, assigning a low trustworthiness level to any signal in that equation which has not previously been assigned a very high or a very low trustworthiness level; e) selecting a further one of said system equations which shares the most number of sensor outputs in common with previously processed expressions and repeating sub-step d) above until all expressions have been processed; f) assigning a trustworthiness level to each sensor according to the trustworthiness level assigned to its sensor outputs; g) if relevant, merge any replicated sensor outputs by utilizing only the sensor output with the highest trustworthiness level within those replicated sensor outputs; h) counting the number of outputs assigned to each trustworthiness level and comparing to the outcome of the previous count; if there is a change, repeating from sub-step d) above; if there is no change then completing the assigning of trustworthiness levels.

The method of the present aspect may include some all or none of the above described preferred and optional features in any combination.

According to a second aspect there is provided a method of classifying a sensor error, the method including the steps of: determining a sensor as having a sensor error using a method according to the above described first aspect, including some all or none of the optional or preferred features of that aspect; processing the system equations and historic sensor output data from said sensor to determine if the error involves spike error, bias error, drift, multiplicative calibration error or precision degradation error and classifying the error as such; and if the error does not involve any of said errors, classifying the error as unknown.

Sensor fault classification can be performed by combining mathematical and statistical techniques that can be utilized to expose bias, drift, multiplicative calibration error, precision degradation and spike error. The sensor fault can then be classified where applicable into bias, calibration error (multiplicative), single spikes, drift, and precision degradation. Other errors, e.g. total failure or random failure may be classified as unknown.

In certain embodiments, in order to detect whether a sensor error involves a spike error, the method involves the sub-steps of: removing from the historic sensor output data the extreme high and extreme low data; re-evaluating system equations which include that sensor output and determining if there is a change in trustworthiness; and if there is a change in trustworthiness, classifying said sensor as having suffered a spike error.

In certain embodiments the step of processing may include performing stepwise regression on any system equations involving an equality to obtain maximum agreement using the factors x(t), t and 1, being the signal, the time index and the bias respectively to obtain multiplicative factors of each of these factors that maximise agreement with the equalities. For example, the maximum agreement may be obtained by linear regression using these factors.

After such processing the type of error may then be determined as follows, if: i) the multiplicative factor of x(t) is greater than 1, a multiplicative calibration error is determined; ii) the multiplicative factor of t is greater than $10^{-3}$ a drift error is determined; or iii) the multiplication factor of the bias term is greater than $10^{-3}$ a bias error is determined.

In certain embodiments, the step of processing involves: filtering the signal with a first order high pass filter; computing the energy of the filtered signal under Fourier transform; and if an increased energy level is computed, a precision degradation error is determined.

Preferably if an error is classified as unknown, the method includes the further step of alerting an operator of the system.

The method of the present aspect may include some all or none of the above described preferred and optional features in any combination.

According to a third aspect there is provided a method for detecting, classifying and mitigating sensor error, the method including the steps of: detecting and classifying a sensor error using a method according to the above described second aspect, including some all or none of the preferred and optional features of that aspect; and mitigating the detected error.

Preferably the step of mitigating includes, if the detected error is a spike error, removing values in future output data from that sensor and replacing them with averaged values of neighbouring time point.

Preferably the step of mitigating includes, if the detected error is a bias error, drift or a multiplicative calibration error, algebraically processing future output data from that sensor to remove the error.

Preferably the step of mitigating includes, if the detected error is a precision degradation error, filtering future output data from that sensor with a filter of order two or more to produce more smoothing effect.

The method of the present aspect may include some all or none of the above described preferred and optional features in any combination.

Further aspects may provide: a computer program comprising code which, when run on a computer, causes the computer to perform the method of any of the first, second or third aspects; a computer readable medium storing a computer program comprising code which, when run on a computer, causes the computer to perform the method of any one of the first, second or third aspects; and a computer system programmed to perform the method of any one of the first, second or third aspects.

According to a fourth aspect there is provided a system for detecting sensor error in a system having a plurality of subsystem and a number of sensors associated with said subsystems, each sensor producing at least one respective sensor output, the system including a processor which is arranged to: identify a plurality of principles of the subsystems, which relate the expected sensor outputs of two or more of said sensors to each other; determine a set of system equations suitable for computation which represent said principles; deduce the degree of reliability of each of said sensor outputs based on whether the or each system equation involving said sensor output is satisfied or not and the known degree of reliability of other sensor outputs in said system equation; and assign a trustworthiness level to each of said sensor outputs based on said deduction.

The principles of the subsystems identified may be derived from first principles, i.e. from underlying engineering or physical relationships, but can also include empirical "rules of thumb" which are derived from experience of the operation of the system or subsystem over time.

The system of this aspect is designed for use in complex systems where partial qualitative or quantitative knowledge is available about the components/subsystems that make up the entire system. However, preferably no comprehensive system model is required. The applicability of the system of this aspect is also not limited to specific systems, unlike heuristics based analytic redundancy techniques.

The system of this aspect can remove the need for hardware redundancy, although such redundancy could improve mitigation in the event of complete sensor failure.

Because it relies on interrelationship and internal consistency between sensor signals, the system of this aspect can still produce valid results where the operating environment changes or the system drifts.

Preferably the system of this aspect uses partial qualitative and quantitative knowledge of the system and the sensors. Sensor fault detection can be performed with a custom designed representation scheme which may include causality, correlation, equalities and inequalities between various sensor outputs, and an associated logic. The logic may be a set of algorithmic steps to iteratively assign a trustworthiness level to the sensors.

The system may therefore be able to automatically detect sensor fault without a comprehensive and accurate system model. It is able to capture and utilize partial and qualitative as well as quantitative knowledge available of the systems/subsystems for sensor fault detection.

In certain embodiments, the processor may be further arranged to, prior to carrying out said deduction, assign a trustworthiness level to one or more of the sensors based on a priori information about said sensor(s). This can allow sensors which are known to be particularly reliable to be pre-classified as such, or similar incorporation of knowledge about the trustworthiness of a particular sensor prior to carrying out the deduction based on the system equations.

The processor may be further arranged to order the system equations based on the number of signals involved and the trustworthiness of those signals and work through the equations in said order starting with the equation with the most signals and the highest degree of reliability. This approach allows the reliability or trustworthiness of the signals to be deduced starting from the situations in which the system has the least uncertainty about which sensors are reliable or not.

In certain embodiments, the processor may be arranged to assign a trustworthiness level by: a) identifying any sensor outputs that can be independently verified and assigning a very high trustworthiness to such outputs; assigning an indeterminate trustworthiness to all other signals; b) sorting the system equations based on the number of sensor outputs involved in each equation; c) counting the number of outputs assigned to each trustworthiness level; d) selecting one of the system equations which involves the lowest number of sensor outputs; e) assigning trustworthiness to the outputs in said equation as follows: i) if the equation is a causation, correlation, or equality, and the equation is satisfied by the sensor outputs involved, assign a very high trustworthiness to all outputs in said equation; ii) if the equation is a causation, correlation, or equality and the equation is not satisfied by the sensor outputs involved, determine whether there is more than one sensor output included in the equation which has not been assigned a very high or a very low trustworthiness level: if there is more than one such output, then assigning a low trustworthiness level to those outputs; and if there is only one such output, then assigning a very low trustworthiness level to that output; iii) if the equation is an inequality and the inequality is satisfied, assigning a high trustworthiness level to any signal in that equation which has not previously been assigned a very high or very low trustworthiness level; iv) if the equation is an inequality and the inequality is not satisfied, assigning a low trustworthiness level to any signal in that equation which has not previously been assigned a very high or a very low trustworthiness level; e) selecting a further one of said system equations which shares the most number of sensor outputs in common with previously processed expressions and repeating sub-step d) above until all expressions have been processed; f) assigning a trustworthiness level to each sensor according to the trustworthiness level assigned to its sensor outputs; g) if relevant, merge any replicated sensor outputs by utilizing only the sensor output with the highest trustworthiness level within those replicated sensor outputs; h) counting the number of outputs assigned to each trustworthiness level and comparing to the outcome of the previous count; if there is a change, repeating from sub-step d) above; if there is no change then completing the assigning of trustworthiness levels.

The system of the present aspect may include some all or none of the above described preferred and optional features in any combination.

According to a fifth aspect there is provided a system for detecting and classifying a sensor error, including: a system for detecting sensor error as described in the above fourth aspect, including some, all or none of the optional or preferred features of that aspect; an error classifier which is arranged to process the system equations and historic sensor output data from said sensor to determine if the error involves spike error, bias error, drift, multiplicative calibration error or precision degradation error and classifying the error as such, and, if the error does not involve any of said errors, classifying the error as unknown.

Sensor fault classification can be performed by combining mathematical and statistical techniques that can be utilized to expose bias, drift, multiplicative calibration error, precision degradation and spike error. The sensor fault can then be classified where applicable into bias, calibration error (multiplicative), single spikes, drift, and precision degradation. Other errors, e.g. total failure or random failure may be classified as unknown.

In certain embodiments the error classifier is arranged to detect a spike error by: removing from the historic sensor output data the extreme high and extreme low data; re-evaluating system equations which include that sensor output and determining if there is a change in trustworthiness; and if there is a change in trustworthiness, classifying said sensor as having suffered a spike error.

In certain embodiments the error classifier is arranged to process the system equations and historic sensor output data by performing stepwise regression on any system equations involving an equality to obtain maximum agreement using the factors $x(t)$, $t$ and $1$, being the signal, the time index and the bias respectively to obtain multiplicative factors of each of these factors that maximise agreement with the equalities.

The error classifier may then be arranged to classify errors on the basis of said stepwise regression as follows, if: i) a multiplicative calibration error if the multiplicative factor of $x(t)$ is greater than 1; ii) a drift error if the multiplicative factor of t is greater than $10^{-3}$; or iii) a bias error if the multiplicative factor of the bias term is greater than $10^{-3}$.

In certain embodiments the error classifier is arranged to: filter the signal with a first order high pass filter; compute the energy of the filtered signal under Fourier transform; and if an increased energy level is computed, determine a precision degradation error.

The system preferably further includes a visible or audible alarm directed at an operator of the system, wherein the error classifier is further arranged to alert an operator using said alarm if an error is classified as unknown.

According to a sixth aspect there is provided a system for detecting, classifying and mitigating sensor error, the system including: a system for detecting and classifying a sensor error as described in the above fifth aspect, including some, all or none of the optional and preferred features of that aspect; and a signal correction device arranged to mitigate the detected error.

Preferably the signal correction device is arranged to, if the detected error is a spike error, remove values in future output data from that sensor and replace them with averaged values of neighbouring time point.

Preferably the signal correction device is arranged to, if the detected error is a bias error, drift or a multiplicative calibration error, algebraically process future output data from that sensor to remove the error.

Preferably the signal correction device is arranged to, if the detected error is a precision degradation error, filter future output data from that sensor with a filter of order two or more to produce more smoothing effect.

Preferably the systems of the above described fourth, fifth and sixth embodiments are arranged to perform the methods of the above described first, second and third aspects respectively, but need not be so configured.

BRIEF DESCRIPTION

Embodiments will now be described by way of example with reference to the accompanying drawings in which.

DETAILED DESCRIPTION

Figure 1:
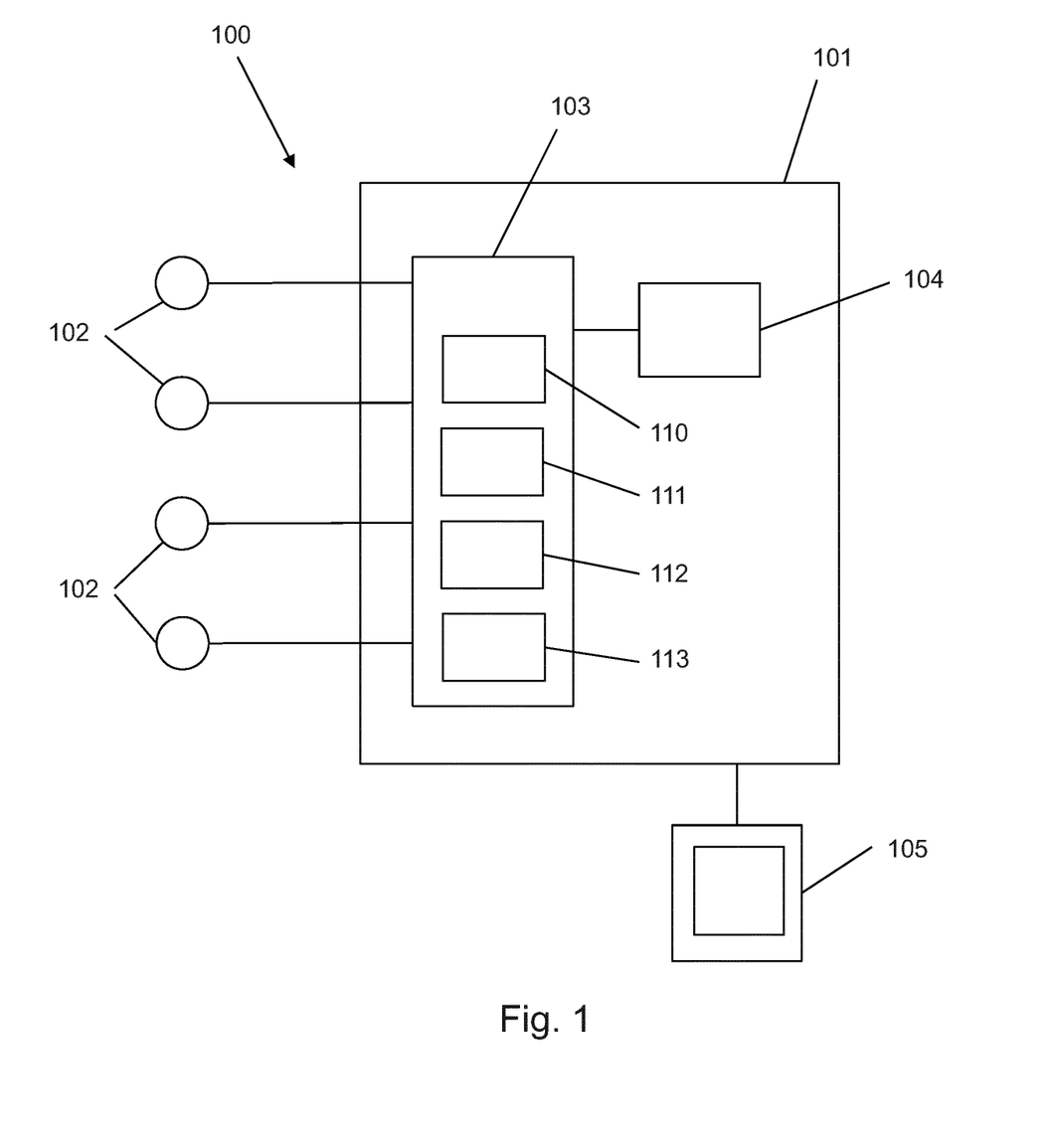
FIG. 1 illustrates a schematic of a system according to various embodiments.

FIG. 1 shows a schematic overview of a system 100 for the detection of sensor error and the classification and mitigation of that sensor error according to various embodiments. The system 100 includes a computer 101 which has a memory 104 and a processor 103. Connected to the processor 103 are a plurality of sensors 102 (for illustration, only four such sensors are shown, but it will be appreciated that there can be any number of such sensors, and in most real systems, the number will be considerably higher).

The processor carries out a number of tasks which will be described in more detail below with respect to methods of the embodiments. These processes include the determining a set of system equations based on information stored in the memory 104 or input by a user through terminal 105 or other data entry devices. The system equations are based on principles of subsystems of the process, apparatus or system being monitored by the sensors 102 and relate the expected sensor outputs of two or more of said sensors to each other. The processor 103 stores the system equations in the memory 104.

Once the system equations have been determined, the processor 103 receives data from the sensors 102 regarding the ongoing state of the system being monitored. The stored system equations are used by a sensor fault detection module 110 running on the processor 103. Detected errors can be classified in a sensor fault classification module 120 and mitigated by a sensor fault mitigation module 130, also running on the processor 103. These modules carry out the methods described below.

Figure 2:
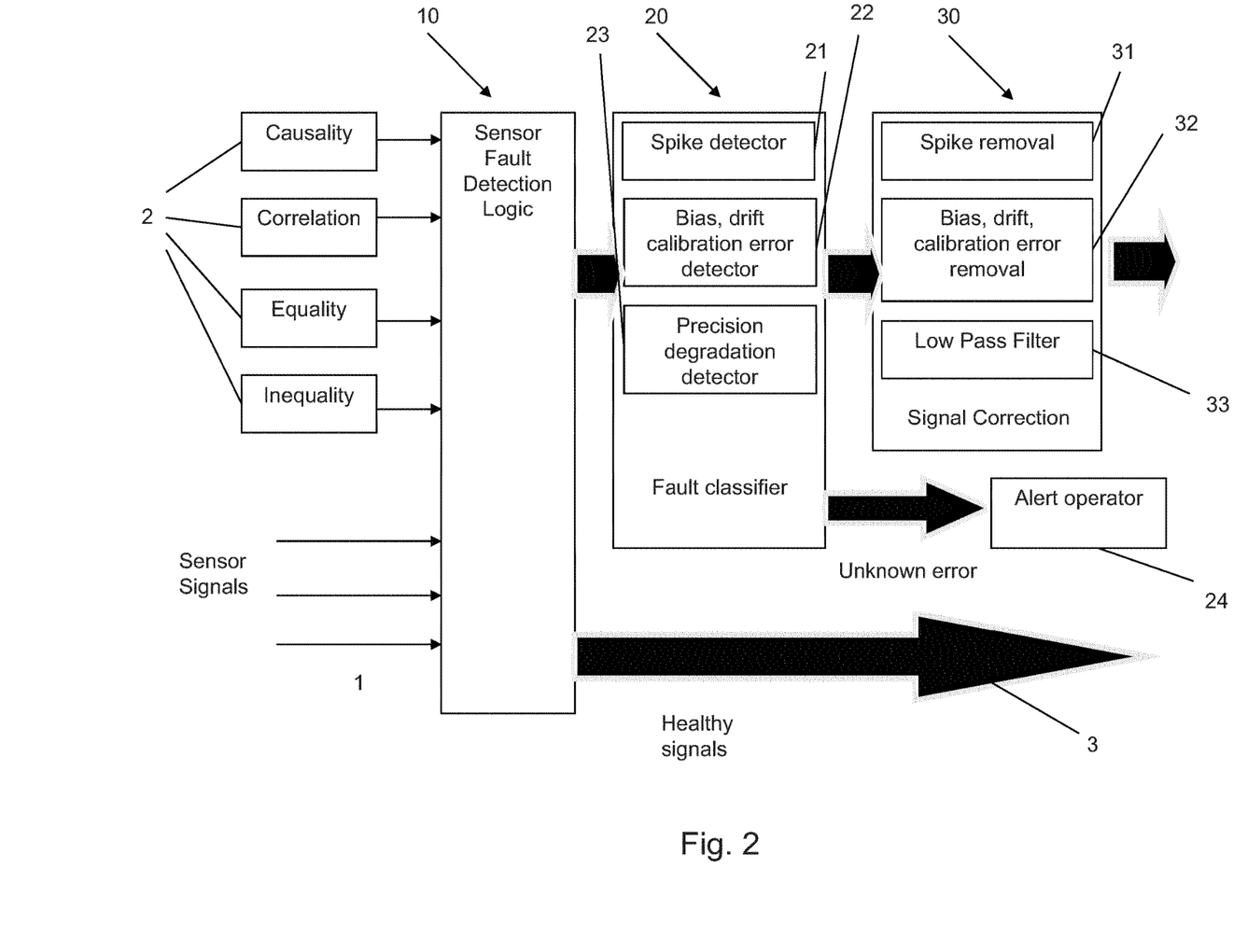
FIG. 2 illustrates the steps in a method of sensor fault detection, classification and mitigation according to various embodiments.
Figure 3A:
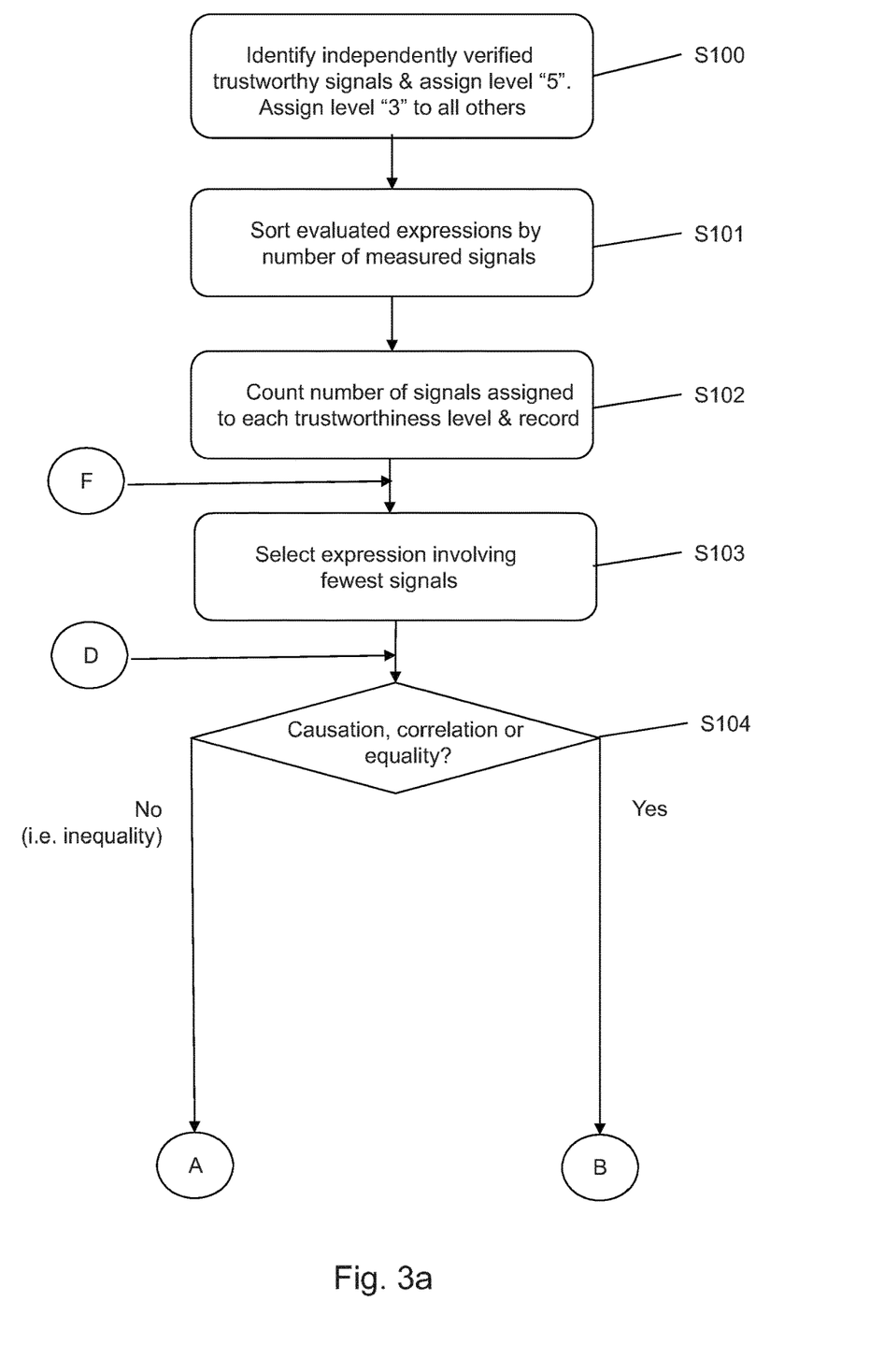
FIGS. 3a-3d illustrates a flowchart showing the steps in an inference method used in the sensor fault detection of a method in accordance with various embodiments.
Figure 3B:
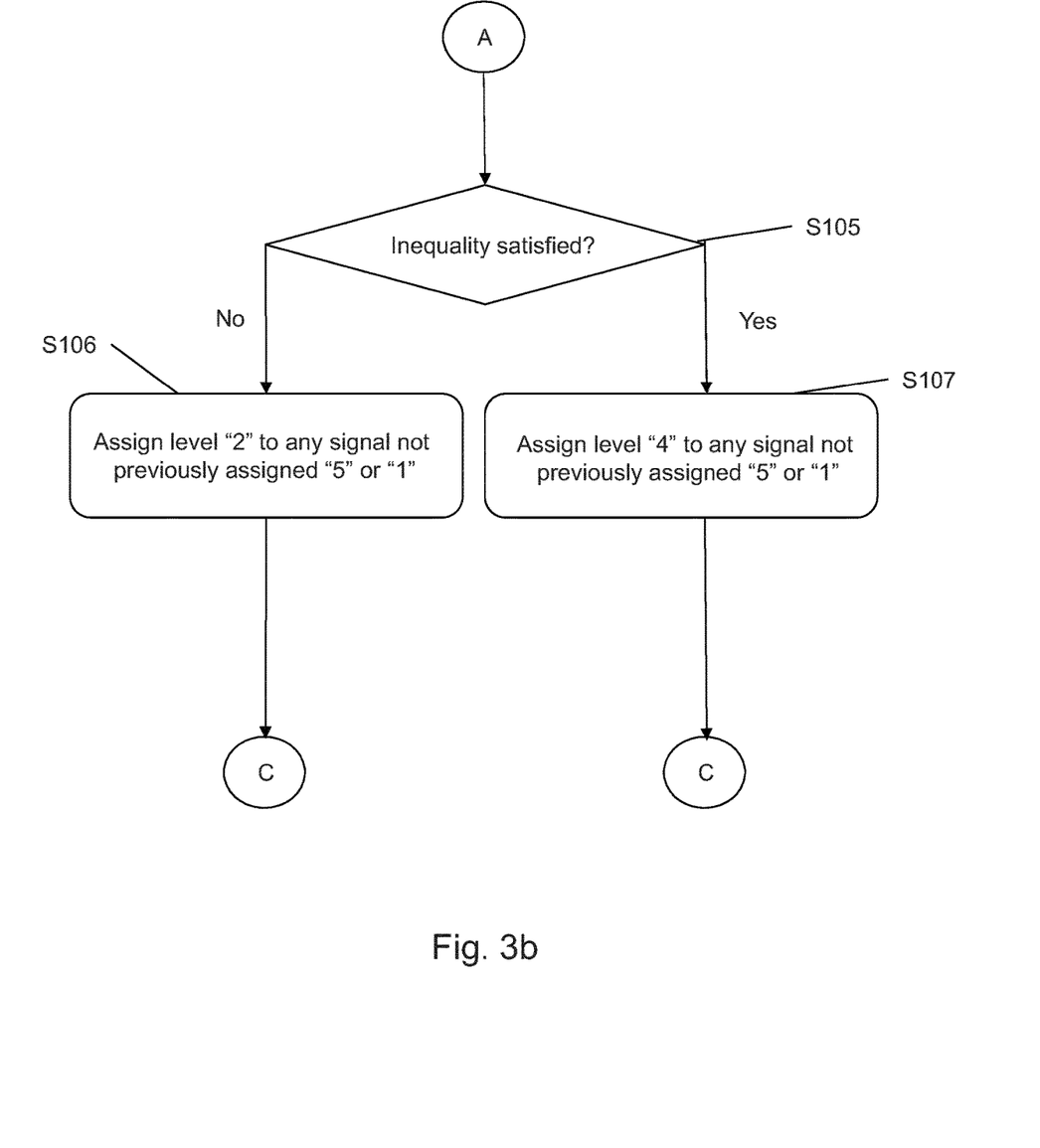
Figure 3C:
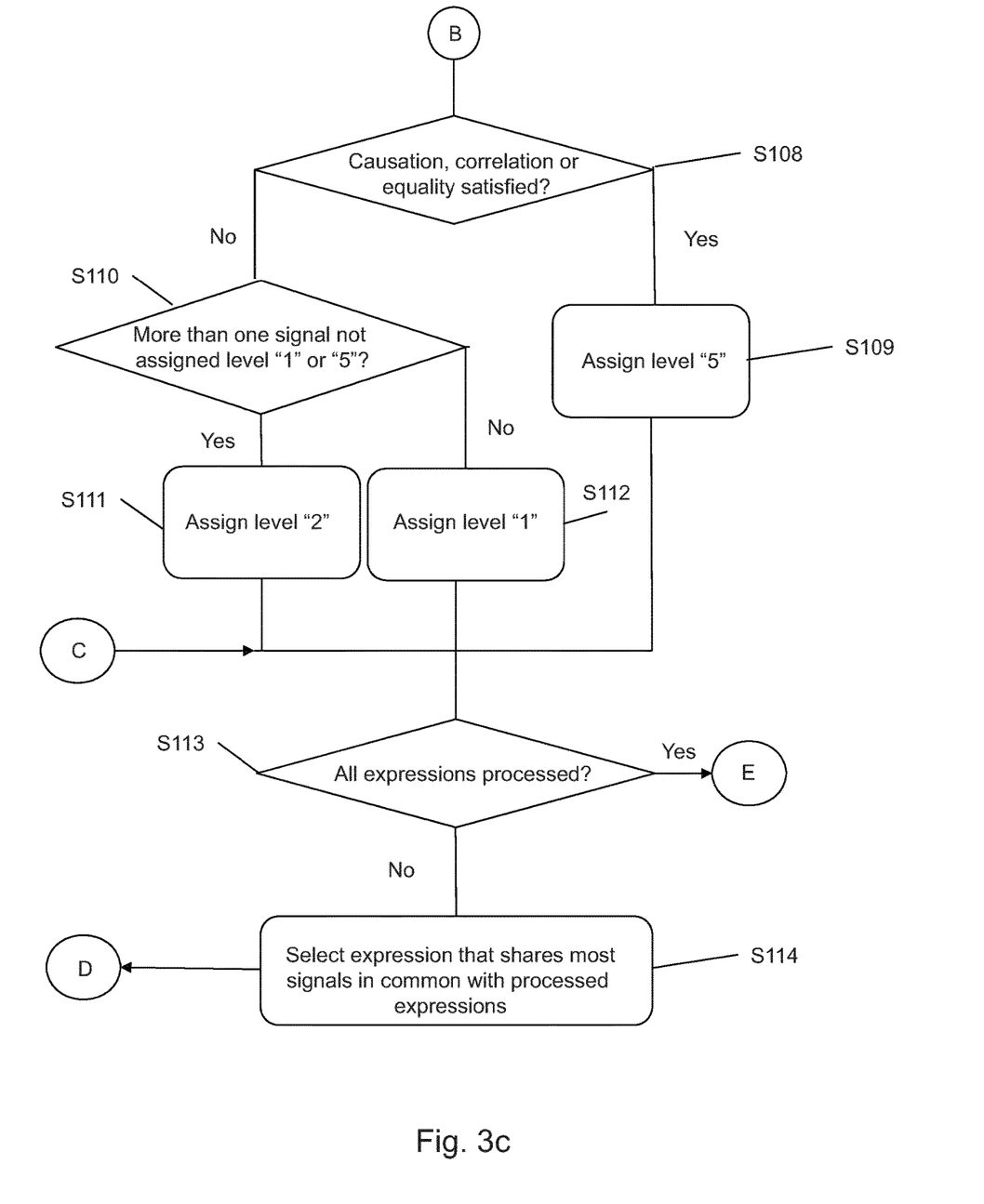
Figure 3D:
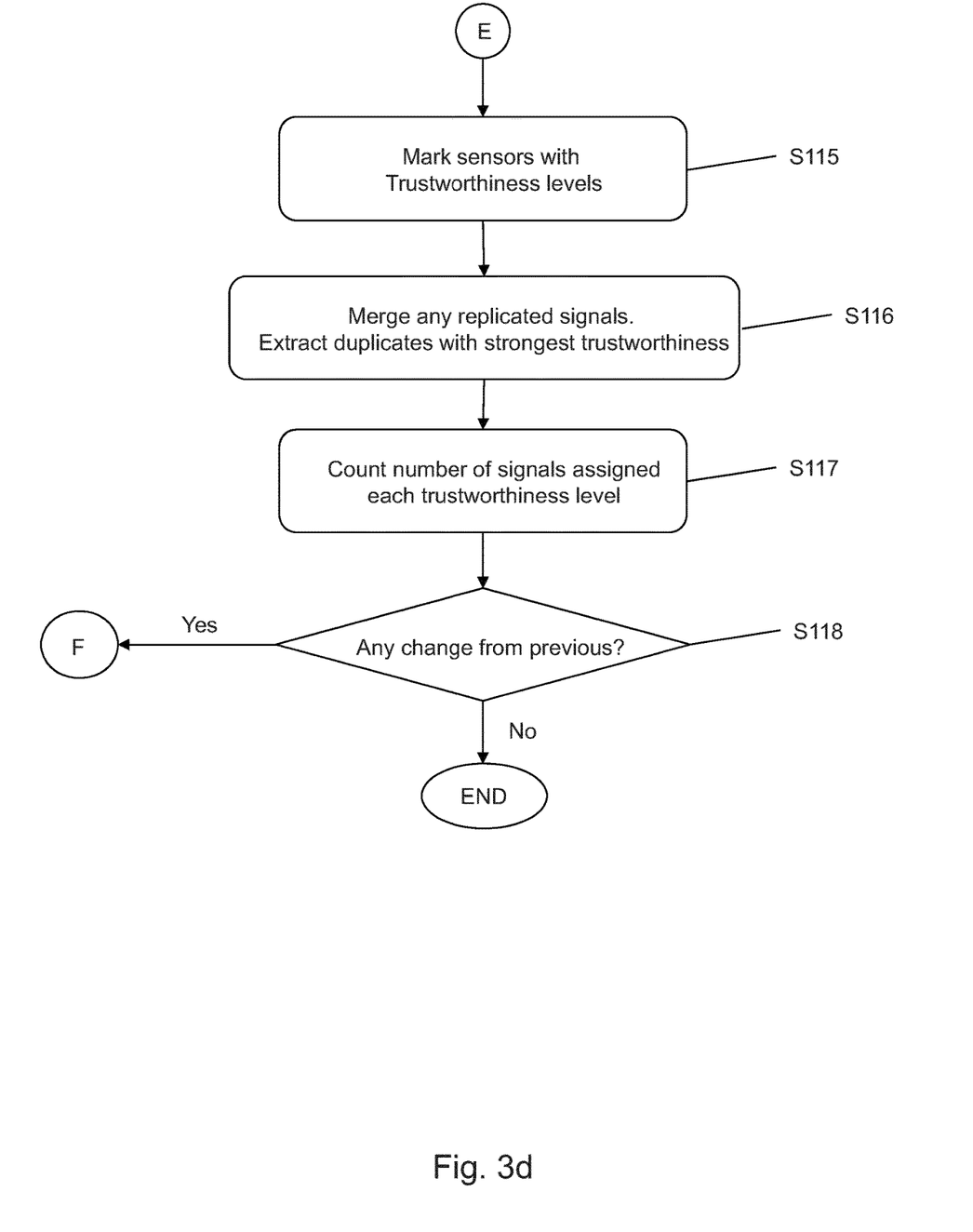

FIG. 2 shows the steps in a method of sensor fault detection, classification and mitigation according to various embodiments, which may be carried out by the processor of the system 100 described above. The method provides for sensor fault detection 10, sensor fault classification 20 and sensor fault mitigation 30.

The method is arranged to:
a) Detect faulty sensor(s) in a network of sensors
b) Classify the sensor fault where applicable into: bias, calibration error (multiplicative), single spikes, drift, and precision degradation. Other errors, e.g. total failure or random failure are grouped under "others".
c) Mitigate fault types specified in (b), except for "others".

Each of these steps will be described in more detail below, based, where appropriate, on examples from marine vessel operation. However, the skilled person will appreciate that the applicability of the method is not limited to marine vessel operation and can be applied in any field which uses sensor fault detection, including all of the fields identified in the referenced prior art documents above.

Sensor Fault Detection

The sensor fault detection method 10 receives a plurality of sensor signals 1.

The sensor fault detection method 10 utilizes partial, qualitative/quantitative knowledge about components or subsystems to reason whether the sensor is faulty. Examples of subsystems in marine vessel operation are: the power distribution and generation subsystem, propulsion subsystem, vessel hull, etc. Here the power distribution and generation subsystem is used as an example.

According to one embodiment, the sensor fault detection method 10 consists of a computational framework to represent and evaluate qualitative and quantitative subsystem behavior and an inference method to perform reasoning on sensor function The representation framework consists of four types of relations 2 which are set up in advance: causation (qualitative), correlation (qualitative), equality (quantitative) and inequality (quantitative).

For example, in a diesel electric power generator, the fuel injection rate and amount of power generated are linked by a causation that must be true at all times. The power generated and heat generated form a correlation (as losses are nonlinear) that must be true at all times. Power balance at various points in the power system is an example of equations that must be true at all times. Operating limits inherent in controllers of the subsystem, e.g. the diesel engine, are examples of inequality that must be true at all times. The operators can be combinatorial, i.e. an equation could be the cause of an inequality, etc.

The causations, correlations, equations and inequalities are evaluated with: time delayed correlation coefficient, correlation coefficient, and equality as well as inequality computation respectively. This evaluation is performed continuously in time.

The inference method identifies the likelihood of sensor fault, based on the evaluated behaviors in which its measurement is involved by applying the following algorithmic process which is also illustrated in the flowchart of FIGS. 3a-3d:

i. Identify the signals, if any, that have been independently verified to be trustworthy. Assign the trustworthiness level of "5" (Very High) to such signals. Assign the trustworthiness level of "3" (Indeterminate) to other signals (S100).

ii. Sort evaluated expressions (i.e. causation, correlation, equation or inequality) based on the number of measured signals involved in the expression (S101).

iii. Manage a count of signals assigned to each trustworthiness level "1", "2", "3", "4", "5" (S102).

iv. Start with an expression involving the least number of signals (S103). Assign levels of signal quality or trustworthiness as follows:
   a. If a causation, correlation, or equality expression is satisfied (S104, S108), all signals involved can be considered trustworthy and marked to have a trustworthiness level of "5" (S109). The assignment of trustworthiness level "5" is valid for the signal in all expressions that involve this signal.
   b. If a causation, correlation, or equality expression is not satisfied and there is more than one signal that has not been assigned the values "1" (Very Low) or "5" on trustworthiness scale (S110), these signals are marked with "2" (Low) (S111). If there is only one such signal, it is marked "1" (S112). Assignment of "1" (Very Low) to any signal is valid for the signal in all expressions that involve this signal.
   c. If an inequality expression is satisfied (S105), any signal involved in it that has not been marked as "5" or "1" through processing of other expressions should be assigned as "4" (High) (S107).
   d. If an inequality expression is not satisfied, any signal involved in the expression that has not been marked as "5" or "1" through processing of other expressions are assigned the level "2" (S106).

v. Proceed to the next expression that share the most number of signals in common with processed expressions and repeat step (iv) until all expressions have been processed (S113, S114).

vi. Mark sensors with associated signals' trustworthiness level (S115).

vii. Merge any group of replicated signals (hardware redundancy, where it is applicable) to prune the list of signals into a minimum necessary. Within each tuple, extract the duplicate with the strongest trustworthiness level and utilize this in the next round (S116).

viii. Count the number of signals assigned "1", "2", "3", "4", and "5" (S117). If there is no change from the count obtained in previous round, stop otherwise go to step (iv) (S118).

On this scale the trustworthiness levels have the following implicit meanings: 5 is definitely correct; 4 is probably correct; 3 is probably not incorrect; but 2 and 1 are definitely bad for any computational methods that follow. If the signals assigned trustworthiness value 4 do not belong to any known error (which are more common, unknown errors are unanticipated and are presumed to be rare), it probably does not have any error, just normal fluctuations. Likewise with signal having value 3. At trustworthiness levels of 2 and 1 the sensor signal has strongly contradicted some equation in the fault detection (i.e. for this signal to be trustworthy, some other signal in the relationship that is known or has been logically deduced to be trustworthy has to, in fact, be untrustworthy), therefore even if it does not fall under known faults, it is a fault that should be checked with a view to correcting or replacing the sensor.

Sensor Fault Classification

The next step of the embodiment is a method 20 designed to classify sensor faults into bias, drift, multiplicative calibration error, spike error and precision degradation.

Generally speaking, bias implies a constant offset to the sensor value. Drift is a time dependent bias. Multiplicative calibration error implies that the sensor reading should be divided by an unknown factor to obtain the true signal level. Precision degradation implies that the noise level in the sensor has increased. Spike error represents a sudden transition to an extremely large positive or negative value.

The method to classify sensor faults involves collection of the set of sensors assigned trustworthiness levels of less than "5" and feed these to each of the following modules:

i. Spike error detector module 21. This module is arranged to prune the 1% largest and smallest value of data and reevaluate expressions in which the sensor's measured signal is involved. Any sensor that changes in trustworthiness level is logged as having suffered from spike error.

ii. Bias, drift and multiplicative calibration error detector module 22. This module is arranged to perform stepwise regression on equality expressions to obtain maximum agreement with the factors: x(t)~the signal, t~time index and 1~bias, to obtain multiplicative factors to x(t), t, that maximizes agreement. For example, linear regression could be carried out on x(t), t and 1 to maximize the fit with the measured data (e.g. find a, b and c such that a.x(t)+b.t+c fits well with the measured data). A multiplicative factor of greater than 1 for x(t) indicates multiplicative calibration error. A multiplicative factor of greater than a very small value close to zero (1E-3) on the bias term (the constant) indicates bias error, and if on the time index indicates sensor drift.

iii. Precision degradation detector module 23. This module is arranged to filter the signal with a first order high pass filter and compute the energy of filtered signal under Fourier transform. An increasing energy level compared to the unfiltered signal indicates noise level has increased and the sensor suffers from precision degradation error.

Faulty sensors (assigned levels of "1" and "2" on trustworthiness scale) that are not identified as having one of the above errors are classified as having an unknown error and an alert 24 is raised to the operator to check or replace this sensor.

Sensor Fault Mitigation

The next step of the embodiment is a method 30 designed to mitigate sensor error. For each of the errors identified (with the exception of unknown errors), the following corrective measures are applied:

Spike error: remove absolute values that go to a very high level with averaged values of neighboring time points.

Bias, drift and multiplicative calibration error: perform algebraic operation to remove bias, drift and multiplicative error. A bias could be removed by addition (or subtraction) of the computed bias, a drift is a time dependent bias (time multiplied by bias—so it is known to be non-decreasing with time) is removed likewise with addition/subtraction, and a multiplicative calibration is removed with a division by the factor identified.

Precision degradation: filter signal with increased filter order i.e. do not use the signal from the sensor but use the low pass filtered signal.

Further embodiments provide for the design of sensor combinations within a system to be monitored (i.e. combining sensors of various price vs accuracy/robustness tradeoffs) based on the accompanying logic to detect sensor malfunction and poor data, such that any malfunction can be identified by applying the logic. The design process can be run to minimize the total price of sensors while ensuring any sensor malfunction can be provably detected. The latter capability may be critical as part of mission critical autonomous/remote controlled vehicles, where decisions are made based on sensor readings alone. Any "strange" levels in the signal could be caused by either the system misbehaving or the sensor being faulty. Such a sensor combination and logic will be able to separate the two causes when a strange reading is observed.

While the systems and methods has been described in conjunction with the exemplary embodiments described above, many equivalent modifications and variations will be apparent to those skilled in the art when given this disclosure. Accordingly, the exemplary embodiments set forth above are considered to be illustrative and not limiting. Various changes to the described embodiments may be made without departing from the spirit and scope of the disclosure.

Also, it is noted that embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

As disclosed herein, the term "computer readable medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as storage medium. A processor(s) may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

All references referred to above are hereby incorporated by reference.

What is claimed is:

1. A method for detecting sensor error in a system having a plurality of subsystems and a number of sensors associated with the subsystems, the method including steps of:
   producing, by each sensor, at least one respective sensor output, the at least one respective sensor output comprising signals;
   identifying a plurality of system equations, or expressions, based on a plurality of principles of the subsystems, which relate expected sensor outputs of two or more of the sensors to each other, the principles being one or more of: engineering relationships, physical relationships, and empirically derived rules;
   deducing a degree of reliability of each of the sensor outputs based on whether each system equation involving the sensor output is satisfied or not and a known degree of reliability of other sensor outputs in the system equation,
   wherein the deducing step comprises ordering the system equations based on a number of the signals and trustworthiness of those signals and working through the system equations in an order starting with the system equation with a highest number of signals and a highest degree of reliability; and
   assigning a trustworthiness level to each of the sensor outputs based on the deduction.

2. The method of claim 1 further comprising:
   prior to the deduction, assigning a trustworthiness level to at least one of the sensors based on a priori information about the at least one sensor.

3. The method of claim 1 wherein the set of system equations includes at least one of: equalities, inequalities, correlations, or causations.

4. The method of claim 3,
   wherein a plurality of levels of trustworthiness include a first level, a second level, a third level, a fourth level and a fifth level, which correspond to a very low trustworthiness, a low trustworthiness, an indeterminate trustworthiness, a high trustworthiness, and a very high trustworthiness, respectively, the levels increasing in trustworthiness from the first level to the fifth level, and
   wherein the step of assigning a trustworthiness level involves the following sub-steps:
   a) identifying any sensor outputs that can be independently verified and assigning a fifth level of trustworthiness to such outputs; assigning a third level of trustworthiness to all other signals;
   b) sorting the system equations based on a number of sensor outputs involved in each system equation;
   c) counting a number of outputs assigned to each trustworthiness level;
   d) selecting one of the system equations which involves a lowest number of sensor outputs;
   e) assigning trustworthiness to the outputs in the system equation as follows:
      i) when the system equation is a causation, correlation, or equality, and the system equation is satisfied by the sensor outputs involved, assign fifth level of trustworthiness to all outputs in the system equation;

ii) when the system equation is a causation, correlation, or equality and the system equation is not satisfied by the sensor outputs involved, determine whether there is more than one sensor output included in the system equation which has not been assigned a fifth level of trustworthiness or a first level of trustworthiness;

when there is more than one such output, then assigning a second level of trustworthiness level to those outputs; and when there is only one such output, then assigning a first level of trustworthiness level to that output;

iii) when the system equation is an inequality and the inequality is satisfied, assigning fourth level of trustworthiness level to any signal in that system equation which has not previously been assigned a fifth level of trustworthiness or a first level of trustworthiness;

iv) when the system equation is an inequality and the inequality is not satisfied, assigning a second level of trustworthiness level to any signal in that system equation which has not previously been assigned a fifth level of trustworthiness or first level of trustworthiness;

e) selecting a further one of the system equations which shares a highest number of sensor outputs in common with previously processed expressions and repeating sub-step d) until all expressions have been processed;

f) assigning a trustworthiness level to each sensor according to the trustworthiness level assigned to its sensor outputs;

g) when relevant, merge any replicated sensor outputs by utilizing only the sensor output with a highest trustworthiness level within those replicated sensor outputs; and h) counting the number of outputs assigned to each trustworthiness level and comparing to the outcome of the previous count; when there is a change, repeating from sub-step d); when there is no change then completing the assigning of trustworthiness levels.

5. A method of classifying a sensor error, the method including steps of:

determining a sensor as having a sensor error using the method according to claim 1;

processing the system equations and historic sensor output data from the sensor to determine when the sensor error involves spike error, bias error, drift, multiplicative calibration error or precision degradation error and classifying the sensor error as such; and when the sensor error does not involve any of those errors, classifying the sensor error as unknown, and wherein, in order to detect whether the sensor error involves spike error, the method involves the sub-steps of:

removing from the historic sensor output data extreme high and extreme low data;

re-evaluating system equations which include that sensor output and determining when there is a change in trustworthiness; and when there is the change in trustworthiness, classifying the sensor as having suffered spike error.

6. The method according to claim 5 wherein the step of processing includes:

performing stepwise regression on any system equations involving an equality to obtain maximum agreement using factors $x(t)$, t and 1, being the signal, time index and bias respectively to obtain multiplicative factors of each of these factors that maximize agreement with equalities among the system equations.

7. The method according to claim 6 wherein, if:

i) the multiplicative factor of $x(t)$ is greater than 1, multiplicative calibration error is determined;

ii) the multiplicative factor of t is greater than 10-3 drift error is determined; or iii) the multiplication factor of the bias term is greater than 10-3 bias error is determined.

8. The method according to claim 5, wherein the step of processing involves:

filtering the signal with a first order high pass filter;

computing energy of the filtered signal under Fourier transform; and when an increased energy level is computed, precision degradation error is determined.

9. A system for detecting sensor error in a system having a plurality of subsystem and a number of sensors associated with the subsystems, the system including a processor which is programmed to:

produce, by each sensor, at least one respective sensor output, the at least one respective sensor output comprising signals;

identify a plurality of system equations, or expressions, based on a plurality of principles of the subsystems, which relate expected sensor outputs of two or more of the sensors to each other, the principles being one or more of: engineering relationships, physical relationships, and empirically derived rules;

deduce a degree of reliability of each of the sensor outputs based on whether each system equation involving the sensor output is satisfied or not and a known degree of reliability of other sensor outputs in the system equation, wherein when deducing the degree of reliability, the processor is programmed to order the system equations based on a number of the signals and trustworthiness of those signals and work through the system equations in order starting with the system equation with a highest number of signals and a highest degree of reliability; and assign a trustworthiness level to each of the sensor outputs based on the deduction.

10. The system of claim 9 wherein the processor is further programmed to, prior to carrying out the deduction, assign a trustworthiness level to at least one of the sensors based on a priori information about the at least one sensor.

11. The system of claim 9 wherein the set of system equations includes at least one of: equalities, inequalities, correlations, or causations.

12. The system of claim 11, wherein a plurality of levels of trustworthiness include a first level, a second level, a third level, a fourth level and a fifth level, which correspond to a very low trustworthiness, a low trustworthiness, an indeterminate trustworthiness, a high trustworthiness, and a very high trustworthiness, respectively, the levels increasing in trustworthiness from the first level to the fifth level, and wherein the processor is programmed to assign the trustworthiness level by:

a) identifying any sensor outputs that can be independently verified and assigning a fifth level of trustworthiness to such outputs; assigning third level of trustworthiness to all other signals;
b) sorting the system equations based on a number of sensor outputs involved in each system equation;
c) counting a number of sensor outputs assigned to each trustworthiness level;
d) selecting one of the system equations which involves a lowest number of sensor outputs;
e) assigning trustworthiness to the sensor outputs in the system equation as follows:
   i) when the system equation is a causation, correlation, or equality, and the system equation is satisfied by the sensor outputs involved, assign a fifth level of trustworthiness to all outputs in the system equation;
   ii) when the system equation is a causation, correlation, or equality and the system equation is not satisfied by the sensor outputs involved, determine whether there is more than one sensor output included in the system equation which has not been assigned a fifth level of trustworthiness or a first level of trustworthiness;
   when there is more than one such output, then assigning a second level of trustworthiness to those outputs; and
   when there is only one such output, then assigning a first level of trustworthiness to that output;
   iii) when the system equation is an inequality and the inequality is satisfied, assigning a high fourth level of trustworthiness level to any signal in that system equation which has not previously been assigned a fifth level of trustworthiness or a first level of trustworthiness;
   iv) when the system equation is an inequality and the inequality is not satisfied, assigning a second level of trustworthiness to any signal in that system equation which has not previously been assigned a fifth level of trustworthiness or first level of trustworthiness;
e) selecting a further one of the system equations which shares a highest number of sensor outputs in common with previously processed expressions and repeating sub-step d) until all expressions have been processed;
f) assigning a trustworthiness level to each sensor according to the trustworthiness level assigned to its sensor outputs;
g) when relevant, merge any replicated sensor outputs by utilizing only the sensor output with a highest trustworthiness level within those replicated sensor outputs;
h) counting the number of sensor outputs assigned to each trustworthiness level and comparing to the outcome of the previous count; when there is a change, repeating from sub-step d); when there is no change then completing the assigning of trustworthiness levels.

* * * * *